(12) United States Patent
Silverbrook

(10) Patent No.: US 6,417,757 B1
(45) Date of Patent: Jul. 9, 2002

(54) BUCKLE RESISTANT THERMAL BEND ACTUATORS

(75) Inventor: Kia Silverbrook, Balmain (AU)

(73) Assignee: Silverbrook Research Pty Ltd, Balmain (AU)

(*) Notice: Subject to any disclaimer, the term of this patent is extended or adjusted under 35 U.S.C. 154(b) by 105 days.

(21) Appl. No.: 09/608,093

(22) Filed: Jun. 30, 2000

(51) Int. Cl.⁷ .................. H01H 71/16; H01H 71/14; B41G 2/05
(52) U.S. Cl. .................. 337/107; 337/107; 337/16; 337/333; 337/298; 347/56; 347/54
(58) Field of Search .................. 337/298, 114, 337/139, 333, 140, 14, 16, 36, 52, 53, 85, 89, 362, 365, 102, 104, 107; 347/20, 23, 44, 54, 56

(56) References Cited

U.S. PATENT DOCUMENTS

| | | | | |
|---|---|---|---|---|
| 4,423,401 A | * | 12/1983 | Mueller | 337/107 |
| 4,864,824 A | * | 9/1989 | Gabriel et al. | 60/527 |
| 5,061,914 A | * | 10/1991 | Busch et al. | 337/140 |
| 5,619,177 A | * | 4/1997 | Johnson et al. | 251/129.01 |
| 5,796,152 A | * | 8/1998 | Carr et al. | 257/415 |
| 5,870,007 A | * | 2/1999 | Carr et al. | 333/197 |
| 6,044,646 A | * | 4/2000 | Sillverbrook | 60/258 |
| 6,067,797 A | * | 5/2000 | Silverbrook | 60/528 |
| 6,087,638 A | * | 7/2000 | Silverbrook | 219/201 |
| 6,180,427 B1 | * | 1/2001 | Silverbrook | 216/27 |
| 6,217,153 B1 | * | 4/2001 | Silverbrook | 347/20 |
| 6,220,694 B1 | * | 4/2001 | Silverbrook | 347/20 |
| 6,227,653 B1 | * | 5/2001 | Silverbrook | 347/20 |
| 6,228,668 B1 | * | 5/2001 | Silverbrook | 347/20 |
| 6,243,113 B1 | * | 6/2001 | Silverbrook | 347/20 |
| 6,245,247 B1 | * | 6/2001 | Silverbrook | 216/27 |
| 6,258,285 B1 | * | 7/2001 | Silverbrook | 216/27 |
| 6,286,935 B1 | * | 9/2001 | Silverbrook | 347/20 |

FOREIGN PATENT DOCUMENTS

| | | |
|---|---|---|
| WO | WO 99/03680 | 1/1999 |
| WO | WO 99/03681 | 1/1999 |

* cited by examiner

Primary Examiner—Anatoly Vortman

(57) ABSTRACT

The invention relates to a thermal bend actuator 7 including:
a first anchor portion 9 for securing to a fixed substrate 2;
a first thermally conductive active beam member 10 secured at a proximal end to said first anchor portion 9 and extending to a movable distal end;
a second beam member 12 similarly anchored at a proximal end to said first anchor portion 9 so as to extend parallel to said first active beam member 10, each of said first and second beam members being directly or indirectly interconnected at their respective proximal ends remote said first anchor portion 9;
wherein said first thermally conductive active beam member 10 is configured to define a labyrinthine conductive pathway 14 having a combined effective length in a direction extending between said fixed proximal end and said movable distal end that exceeds twice the effective direct linear path therebetween.

10 Claims, 6 Drawing Sheets

BUCKLE RESISTANT THERMAL BEND ACTUATORS

FIELD OF THE INVENTION

The present invention relates to thermal bend actuators and more particularly to a bend actuator structure that is suitable for use in the design of low powered generally elongate mechanisms, which using prior art structures may have been prone to buckling during operation.

The invention has been developed primarily for use with transient thermal bend actuators, that is actuators utilising parallel conductor beams of identical materials so as to be sensitive primarily to relative temperature differences and thereby less sensitive to ambient conditions, and will be described hereinafter with reference to this preferred application. However, it will be appreciated by those skilled in the art, that the inventive concept is equally applicable to non-transient thermal bend actuators including, for example, bimetallic actuators including electro mechanical thermal switches.

BACKGROUND OF THE INVENTION

The present invention has been developed as a means of overcoming problems commonly encountered during the manufacture and design of micro-electro mechanical systems (MEMS), which are produced via a multi-stage process of successively depositing and etching thin film layers of different materials using integrated circuit CMOS technology.

Typically, transient thermal bend actuators used in MEMS are formed by depositing interconnected parallel spaced apart thermally isolated layers or beams of conductive material within surrounding layers of non-conductive structural material such as silicon. The beams are secured at one end at an anchor and connected at the other to the movable part of the mechanism. The actuator is then controlled by the passage of a heating current through one of these layers known as the active beam member.

In order to minimise the power required to operate the mechanisms incorporating these actuators, it is desirable to use relatively long actuating arms so as to achieve a balance between magnifying the maximum displacement at the free distal end of the lever mechanism, achieving the requisite applied force, and controlling the voltage and amount of current required to effectively operate the actuator.

It has been found when modelling such devices, that, not unexpectedly, the longer the unsupported span of the parallel beam members of the actuator, the more likely that some degree of buckling is going to occur, the mode being determinable by a number of factors. Whilst it is possible to predict the buckling mode and come up with satisfactorily operational designs that allow for such buckling, this is likely to result in a less efficient and/or less predictable mode of operation of the device.

Accordingly, it has been preferable prior art practice to try and stiffen the effective beam portion of the actuator to minimise the buckling. This can be done in a number of ways including forming stiffening struts and other reinforcing structures that extend transversely between and often beyond the two actuator beams. However, this can have two disadvantages. Firstly, the additional structural material and general stiffening of the lever may result in higher operational power requirements. Further, the additional mass of the structure contacting the active beam member may act as a heat sink, increasing the thermal losses during heating, thereby again increasing the power required to operate the device.

It is an object of the present invention to provide a thermal bend actuator structure which overcomes or at least ameliorates one or more of the above discussed disadvantages of the prior art, or which at least offers a useful alternative.

SUMMARY OF THE INVENTION

According to a first aspect of the invention there is a provided a thermal bend actuator including:

a first anchor portion for securing to a fixed substrate;

a first thermally conductive active beam member secured at a proximal end to said first anchor portion and extending to a movable distal end;

a second beam member similarly anchored at a proximal end to said first anchor portion so as to extend parallel to said first active beam member, each of said first and second beam members being directly or indirectly interconnected at their respective distal ends remote said first anchor portion;

wherein said first thermally conductive active beam member is configured to define a labyrinthine conductive pathway having a combined effective length in a direction extending between said fixed proximal end and said movable distal end that exceeds the effective direct linear path therebetween.

The term "effective length" is used to refer to the heating portion of the conductive pathway over which bend inducing thermal expansion occurs.

In a first preferred form, the labyrinthine pathway is configured to define a plurality of parallel strips oriented to extend in a direction that is parallel to the direction between said respective proximal and distal ends, said strips being serially interconnected to define a single pathway. As this pathway in the preferred embodiment is formed on a thin film layer, this results in a square wave type pattern extending across the active beam member.

Preferably, the labyrinthine pathway starts and ends at the proximal end of the active beam adjacent the anchor portion, so that power need only be supplied to the active beam member from the fixed portion of the mechanism. In the first preferred form, this results in a structure having an even number of parallel serially interconnected strips.

Desirably, the first active beam member and/or the second beam member each has a first anchor element formed as one or more tabs at its proximal end, and a second anchor element, similarly preferably formed as one or more tabs for securing to the movable lever of the device to which the actuator is to be connected.

Preferably, the thermal bend actuator is a transient thermal bend actuator in which the second beam member is formed from a identical material to that of the first member and which has substantially identical physical configurations along the portions that extend parallel to the operational portion of the first active beam member, the ends of the beams remote the anchor portion being held in a spaced apart relationship by means of an intermediate non conducting material extending therebetween.

BRIEF DESCRIPTION OF THE DRAWINGS

A preferred embodiment of the invention will now be described, by way of example only, with reference to the accompanying drawings in which.

DESCRIPTION OF PREFERRED AND OTHER EMBODIMENTS

Figure 1:
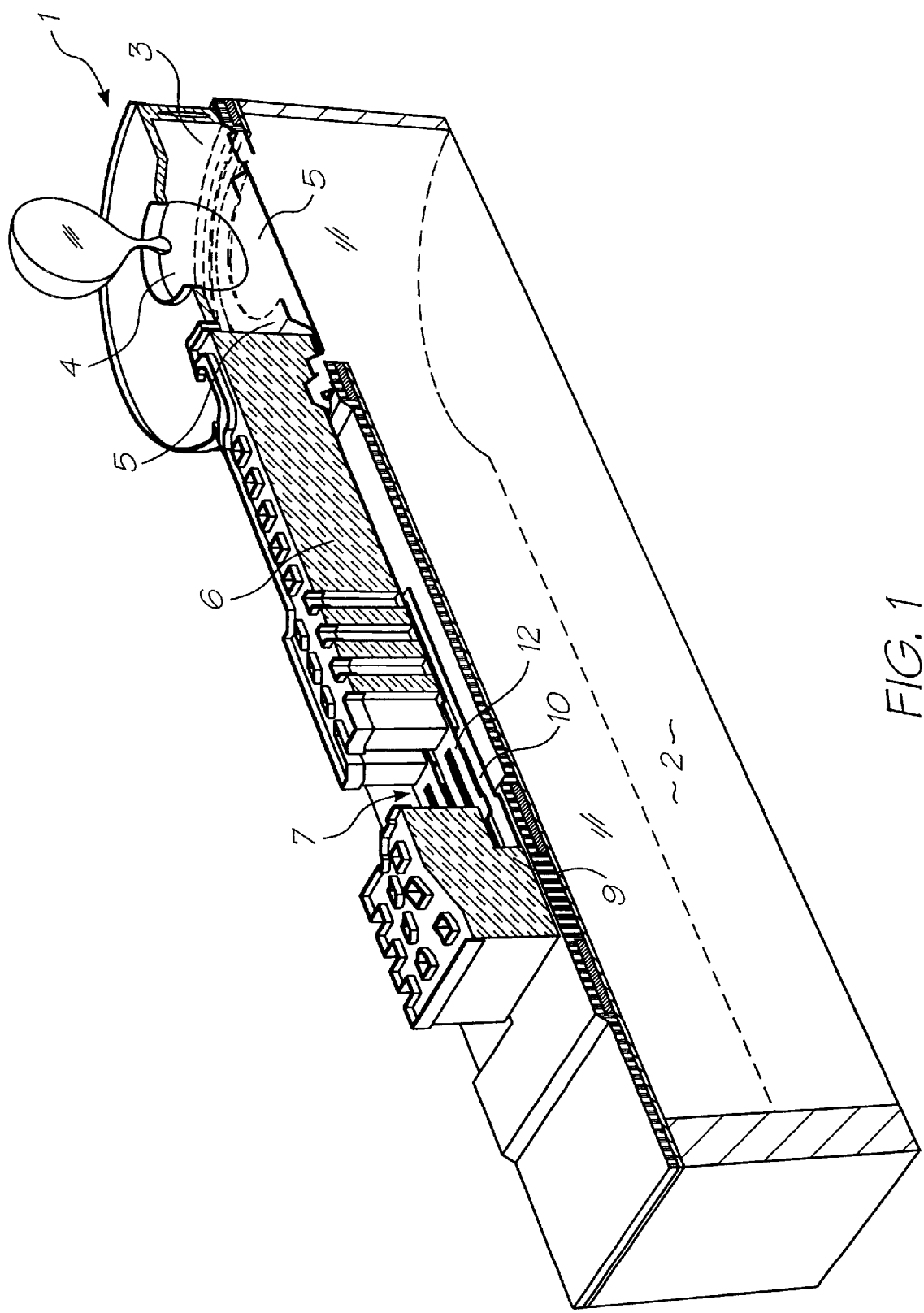
FIG. 1 is a perspective sectional view of an inkjet paddle ejector mechanism utilising a first embodiment transient thermal bend actuator in accordance with the invention illustrated in the return or home position.

The preferred embodiment illustrated in the accompanying drawings is an inkjet paddle ejector mechanism 1 produced using MEMS technology in which structures are created via a multi-stage process of successively depositing and etching thin film layers of different materials using integrated circuit CMOS processes.

The mechanism 1 is formed on top of a CMOS substrate 2 which is the portion that contains the micro electronics used to control the system as a whole. The inkjet ejector mechanism 1 includes an ink chamber 3 having an outlet aperture 4. Disposed within the chamber 3 is an ejector paddle 5 which is moved in a direction toward or away from the substrate 2 by means of a lever arm 6. The arm is mounted with the substrate 2 via an intermediate thermal bend actuator mechanism shown generally at 7.

The actuator mechanism 7 includes a first anchor portion shown generally at 9 which in use is secured to the substrate 2. Connected with and extending from the anchor portion 9 is a first thermally conductive active beam member 10. Extending at a spaced distance above the active beam member is a second, in this case inactive, beam member 12 which is similarly anchored at its proximal end to the first anchor portion 9.

Figure 3:
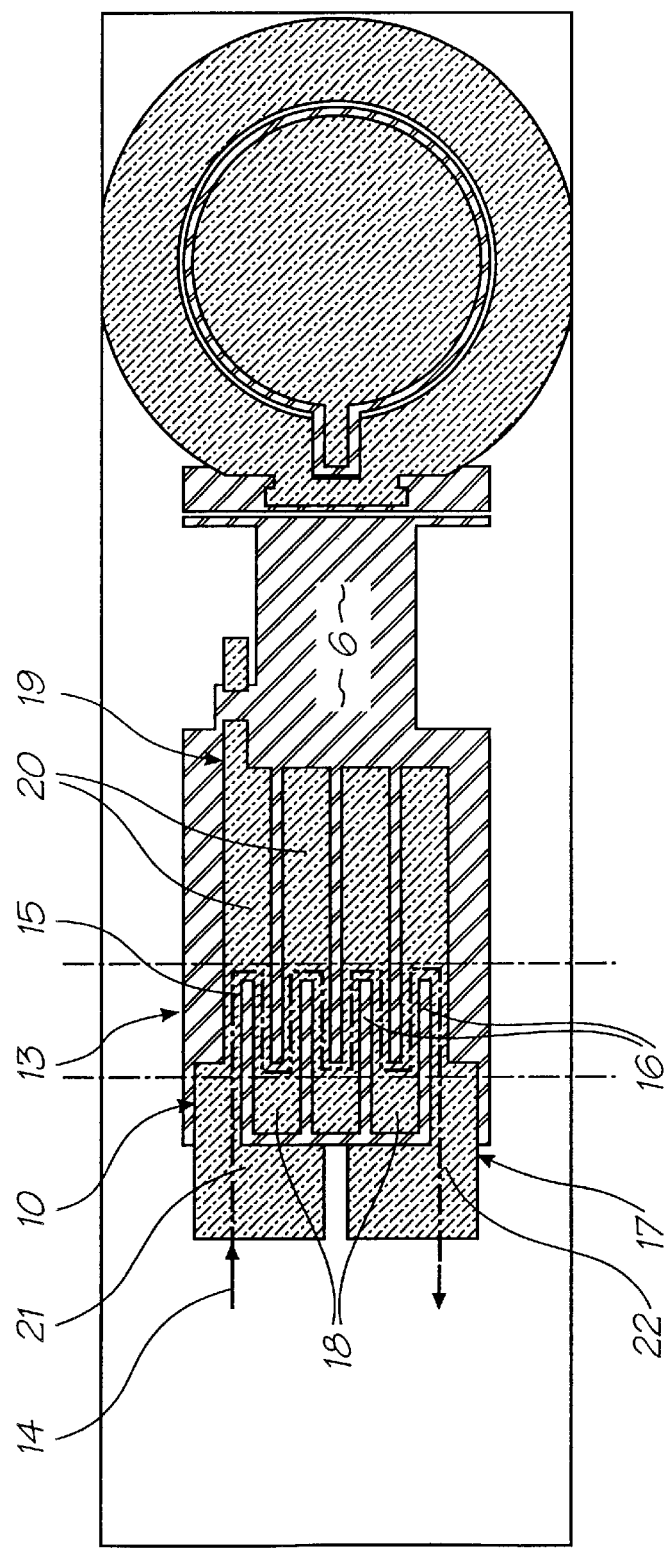
FIG. 3 is a sectional side view of the device shown in the previous figures together with a plan view of the lower thermally conductive active beam member.
Figure 3:
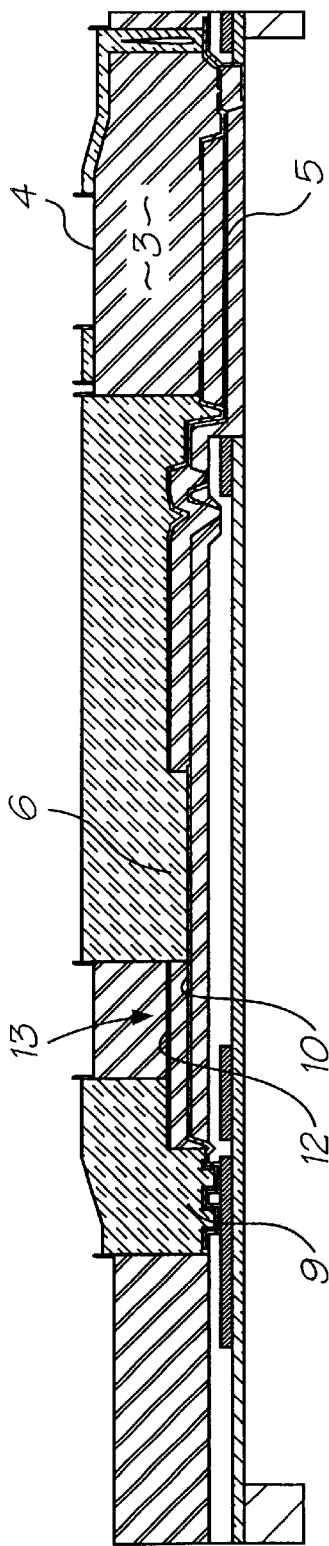
Figure 4:
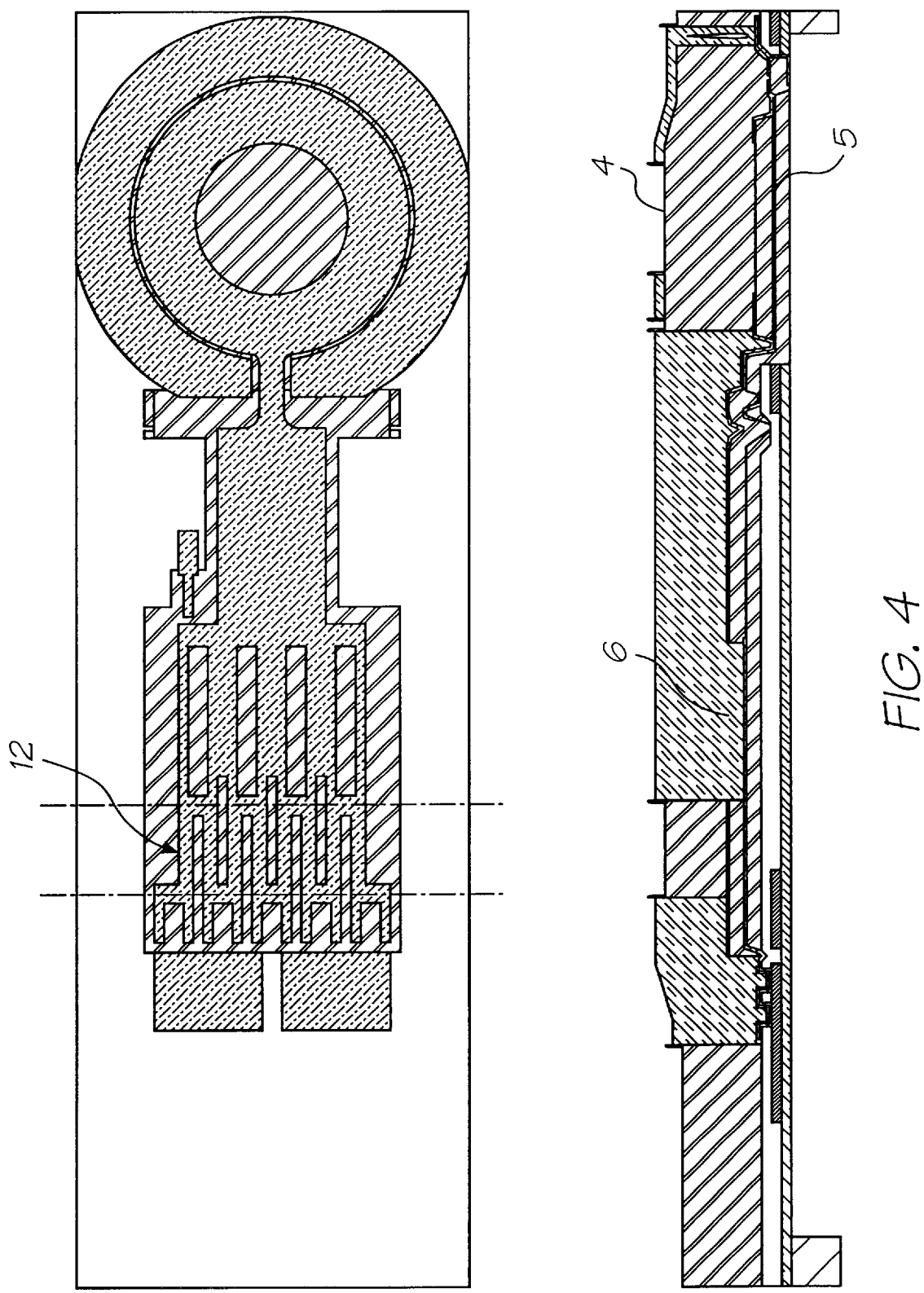
FIG. 4 is a sectional side view of the device of the previous figures together with a plan view of the layer forming the second passive beam member.
Figure 5:
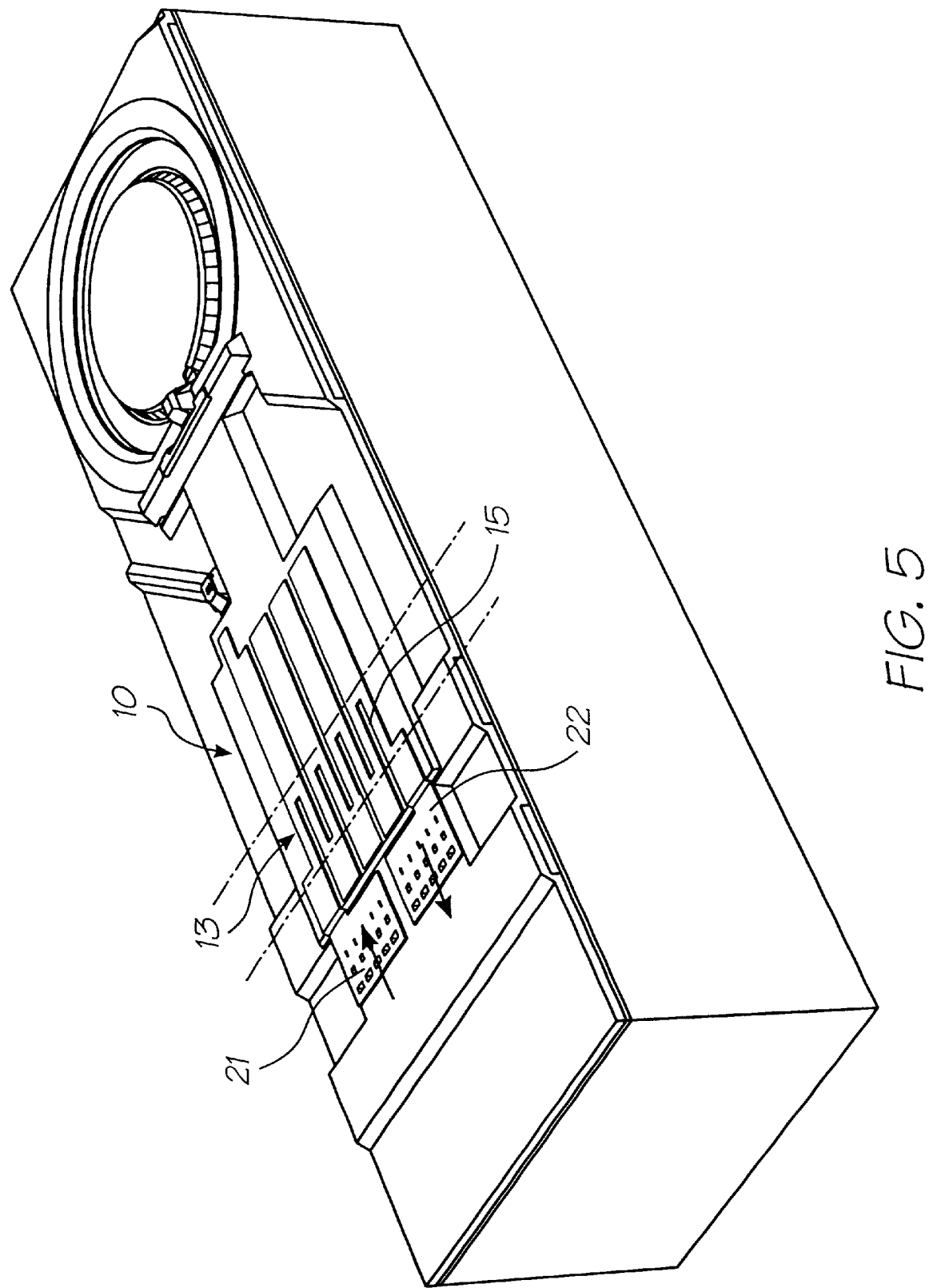
FIG. 5 is a perspective view showing the active layer of FIG. 3.
Figure 6:
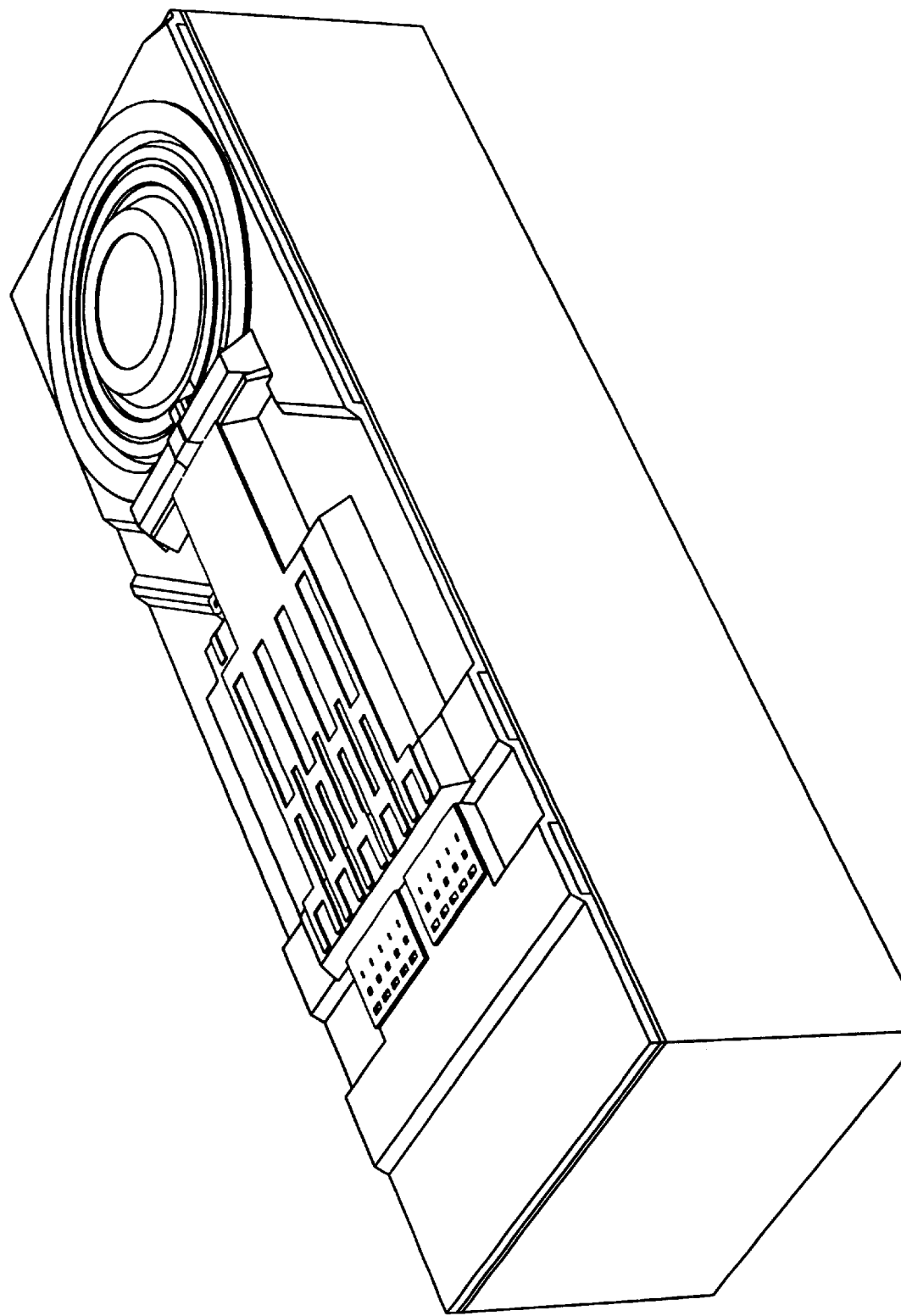
FIG. 6 is a perspective view showing the passive layer of FIG. 4.

The configuration of the lower active beam 10 is best shown in FIGS. 3 and 5. It can be seen that the operational portion of the beam is that which spans the gap between the anchor portion 9 and the closest end of the lever arm 6 which is referred to as the active region 13 identified in the various plan views as that area between the pair of dotted lines as shown.

The current pathway 14 is shown by the shaded line with arrow indicated on the drawings with the labyrinthine portion 15 extending within the active region 13. Within this portion it can seen that there are a number of parallel strips 16 which extend between a first anchor element 17 formed as a plurality of tabs 18 at the proximal end and a second anchor element 19 similarly preferably formed as a plurality of tabs 20 for securing to the movable lever arm 6 of the inkjet ejection mechanism 1. Two of the proximal end tabs 18 are extended to form electrical contacts 21 and 22.

In the example illustrated, the thermal bend actuator is a transient thermal bend actuator, the second inactive beam member 12 being formed from the same material as that of the active member and having substantially identical physical configurations along the labyrinthine portions that extend parallel to the operational portion of the first active beam member, that is to the portion of the device that extends directly parallel to the active region 13. Accordingly, while the overall size, shape and configuration of the deposited layers forming the active and inactive beams 10 and 12 are quite different, they are equivalent at the relevant locations, that is in line with the active region 13. The relative sizes of the tabs at either end of the active and inactive beams is immaterial to the operation of the device and occurs purely as a result of other unrelated manufacturing considerations.

Figure 2:
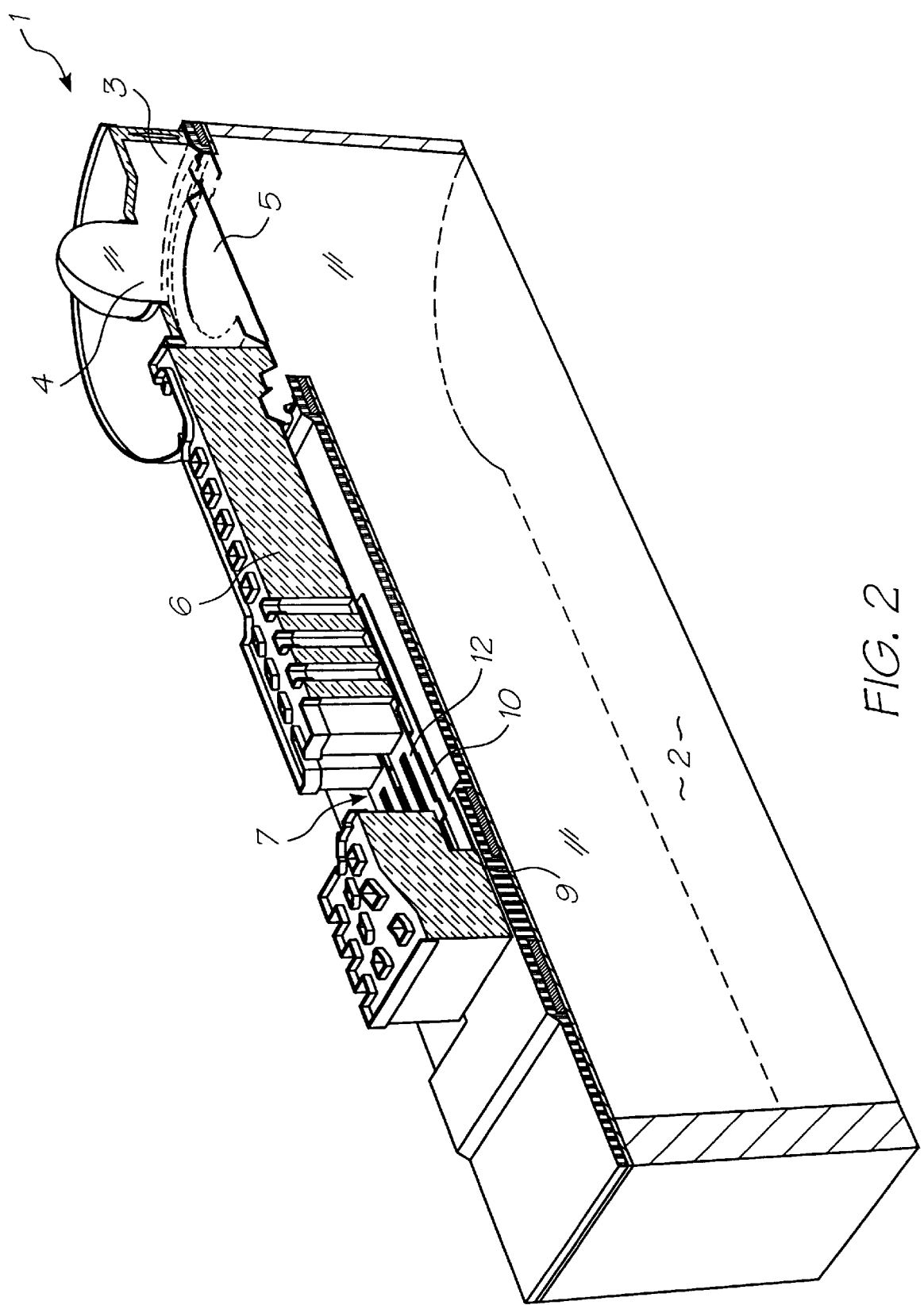
FIG. 2 is a perspective sectional view of the device of FIG. 1 illustrated in the actuated position.

In use, current is applied to electrical contact 21. As the current passes through the reduced section labyrinthine portion 15 within the active region 13, the increased resistance causes relative thermal expansion of the strips 16 in a direction between the proximal and distal ends thereby applying a differential stress to the underside of the actuator 7 causing the lever to bend upwardly away from substrate 2. This in turn causes a pivoting of the lever arm 6 which raises the ejector paddle 5 upwardly toward the outlet aperture 4, thereby pushing a drop of ink out of the chamber 3 as shown in FIG. 2. Once application of the current is ceased, the active beam 10 cools and returns to the home position as shown in FIG. 1, the drop of ink simultaneously breaking away from the aperture 4.

In this manner, the same effective thermal actuation force is achieved via a much shorter but potentially wider actuation device than the equivalent in the prior art, thereby significantly reducing the likelihood and/or degree of buckling that may occur during operation.

Although the invention has been described with reference to one specific preferred example, it will be appreciated by those skilled in the art that the invention can be embodied in many other forms.

I claim:

1. A thermal bend actuator including:
    a first anchor portion for securing to a fixed substrate;
    a first thermally conductive active beam member secured at a proximal end to said first anchor portion and extending to a movable distal end;
    a second beam member similarly anchored at a proximal end to said first anchor portion so as to extend parallel to said first active beam member, each of said first and second beam members being directly or indirectly interconnected at their respective distal ends remote said first anchor portion;
    said first thermally conductive active beam member being configured to define a labyrinthine conductive pathway having a combined effective length in a direction extending between said fixed proximal end and said movable distal end that exceeds the effective direct linear path therebetween;
    wherein the first active beam member has a first anchor element formed at its proximal end and a second anchor element formed at its distal end.

2. A thermal bend actuator according to claim 1 wherein the labyrinthine pathway is configured to define a plurality of parallel strips oriented to extend in a direction that is parallel to the direction between said respective proximal and distal ends, said strips being serially interconnected to define a single pathway.

3. A thermal bend actuator according to claim 1 wherein the labyrinthine pathway starts and ends at the proximal end of the active beam adjacent the anchor portion so that power need only be supplied from a fixed portion.

4. A thermal bend actuator according to claim 2 wherein said first and second anchor elements are anchor tabs.

5. A thermal bend actuator according to claim 4 wherein each anchor tab secures 1 or 2 strips.

6. A thermal bend actuator according to claim 4 wherein the anchor tabs at each side of the proximal end of the active beam are also configured to provide electrical contact surfaces for the activating current.

7. A thermal bend actuator according to claim 1 configured to act as a transient thermal bend actuator, the second beam member being formed from an identical material to that of the first beam member having substantially identical physical configurations along the portions that extend parallel to the operational portion of the first active beam member, the ends of the beams remote the anchor portion being held in a spaced apart relationship by means of an intermediate non-conducting material extending therebetween.

8. A thermal bend actuator including:

a first anchor portion for securing a fixed substrate;

a first thermally conductive active beam member secured at a proximal end to said first anchor portion and extending to a movable distal end;

a second beam member similarly anchored at a proximal end to said first anchor portion so as to extend parallel to said first active beam member, each of said first and second beam members being directly or indirectly interconnected at their respective distal ends remote said first anchor portion;

said first thermally conductive active beam member is configured to define a labyrinthine conductive pathway having a combined effective length in a direction extending between said fixed proximal end and said movable distal end that exceeds the effective direct linear path therebetween;

wherein the second beam member is formed from an identical material to that of the first beam member having substantially identical physical configurations along the portions that extend parallel to the operational portion of the first active beam member, the ends of the beams remote the anchor portion being held in a spaced apart relationship by means of an intermediate non-conducting material extending therebetween.

9. A thermal bend actuator according to claim 8 wherein the labyrinthine pathway is configured to define a plurality of parallel strips oriented to extend in a direction that is parallel to the direction between said respective proximal and distal ends, said strips being serially interconnected to define a single pathway.

10. A thermal bend actuator according to claim 8 wherein the labyrinthine pathway starts and ends at the proximal end of the active beam adjacent the anchor portion so that power need only be supplied to the fixed portion of the mechanism.

* * * * *